(12) United States Patent
Wang et al.

(10) Patent No.: US 6,888,157 B1
(45) Date of Patent: May 3, 2005

(54) N-GATE/N-SUBSTRATE OR P-GATE/P-SUBSTRATE CAPACITOR TO CHARACTERIZE POLYSILICON GATE DEPLETION EVALUATION

(75) Inventors: Zhigang Wang, San Jose, CA (US); Nian Yang, San Jose, CA (US); Yue-song He, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 266 days.

(21) Appl. No.: 09/917,440

(22) Filed: Jul. 27, 2001

(51) Int. Cl.$^7$ ............................................. H01L 23/58
(52) U.S. Cl. ............................................................ 257/48
(58) Field of Search ........................ 297/48, 528, 532, 297/288; 324/769

(56) References Cited

U.S. PATENT DOCUMENTS

| | | | |
|---|---|---|---|
| 4,247,826 A | * | 1/1981 | Gappa et al. |
| 5,179,433 A | * | 1/1993 | Misawa et al. |
| 6,028,324 A | * | 2/2000 | Su et al. |
| 6,469,316 B1 | * | 10/2002 | Bush et al. |

* cited by examiner

Primary Examiner—Nathan J. Flynn
Assistant Examiner—Kevin Quinto (57) ABSTRACT

A capacitor structure for characterizing polysilicon gate depletion effects of a particular semiconductor fabrication process. In one embodiment, an N-Gate/N-Substrate capacitor is fabricated with the semiconductor fabrication process which is being evaluated for its polysilicon gate depletion effects. The N-gate of capacitor structure is driven to depletion while the N-substrate is simultaneously driven to accumulation. Capacitance-voltage measurements are taken. Based on these CV measurements, the polysilicon depletion effects are then obtained for that particular semiconductor fabrication process. In another embodiment, a P-Gate/P-Substrate capacitor is fabricated with the semiconductor fabrication process. The gate of the P-Gate/P-Substrate capacitor is driven to depletion while the substrate is simultaneously driven to accumulation. Based on the CV measurements performed on the P-Gate/P-Substrate capacitor, the polysilicon depletion effects can be obtained for that particular semiconductor fabrication process. In a third embodiment, a capacitor structure device is used to evaluate the polysilicon gate depletion effects of a semiconductor fabrication process. Different voltages are selectively applied to the gate of either an N-Gate/N-Substrate capacitor or a P-Gate/P-Substrate capacitor while its capacitance is measured. Based on the CV measurements, the polysilicon gate depletion effects for that particular semiconductor fabrication process is characterized.

12 Claims, 12 Drawing Sheets

Step 1

```
                                901
─────────────────────────────────────
          Si (Substrate)
─────────────────────────────────────
```

Step 2

```
─────────────────────────────────────
       3000 Å   Oxide        902
─────────────────────────────────────
                                901
              Si
─────────────────────────────────────
```

Step 3

```
    ─────────        ─────────
        903              904
    Isolation Oxide  Isolation Oxide
    ─────────        ─────────
                                901
              Si
─────────────────────────────────────
```

Figure 9A

Step 4

Step 5

Step 6

N-GATE/N-SUBSTRATE OR P-GATE/P-SUBSTRATE CAPACITOR TO CHARACTERIZE POLYSILICON GATE DEPLETION EVALUATION

TECHNICAL FIELD

The present invention relates to the field of semiconductor process evaluation. More specifically, the present invention pertains to a novel N Gate/N-Substrate or P Gate/P-Substrate capacitor to evaluate polysilicon gate depletion characteristics.

BACKGROUND ART

Rapid advances made in semiconductor fabrication processes enable the production of faster, more powerful, and less expensive semiconductor chips. Although the same principles for fabricating semiconductor chips are applied, there exist a wide array of different semiconductor fabrication processes. The particular fabrication process being utilized depends heavily on the type of chip being manufactured. For example, the semiconductor process for fabricating a memory chip is quite different than that of fabricating a microprocessor. Not only are there many different accepted processes for fabricating specific semiconductor chips, a particular process can be customized to meet the unique specifications and requirements of an end user. Furthermore, designers are continuously "tweaking" their processes in attempts to maximize a chip's performance. Even the slightest change to any one of many different variables in the semiconductor fabrication process can result in differing electrical characteristics of the final chip.

Consequently, every time a particular semiconductor fabrication process is modified, adapted, or otherwise altered, rigorous tests must be conducted to determine the electrical characteristics produced by that particular fabrication process. The most simplistic way to test a particular semiconductor fabrication process is to fabricate and measure the electrical characteristics of the fully functional chips made from that particular process. However, this is quite time consuming, labor intensive, and expensive.

Rather than laying out, fabricating, and testing an entire chip, designers have discovered that a chip's performance can be extrapolated by measuring certain electrical characteristics exhibited by the resultant wafer. One of the key indicators of performance relates to a wafer's exhibited polysilicon gate depletion. The polysilicon gate depletion can be characterized by fabricating a few, scattered "test" transistors. Based on these test transistors, Capacitance-Voltage (CV) measurements can be taken to determine the corresponding polysilicon gate depletion effect at those locations. And based in part from this observed polysilicon gate depletion effect, designers can accurately model the overall performance of chips, were they to be fabricated from this particular process. Thereby, designers can accurately predict the speed, power consumption, etc. of integrated circuits which are fabricated from a particular process by simply constructing a few test transistors and taking CV measurements instead of going through the full, rigorous manufacturing process.

Figure 1:
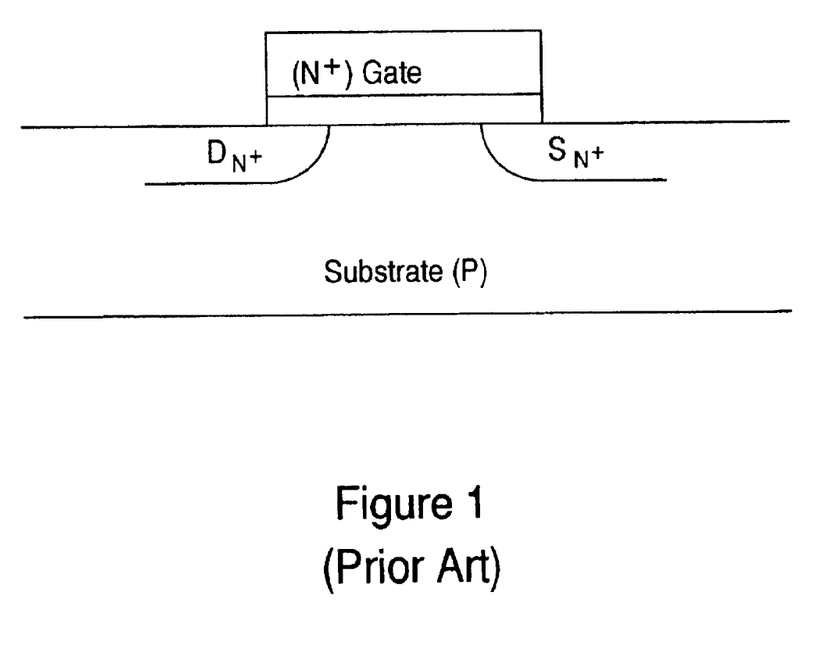
FIG. 1 shows a MOSFET which is commonly used today to evaluate CV characteristics.
Figure 2:
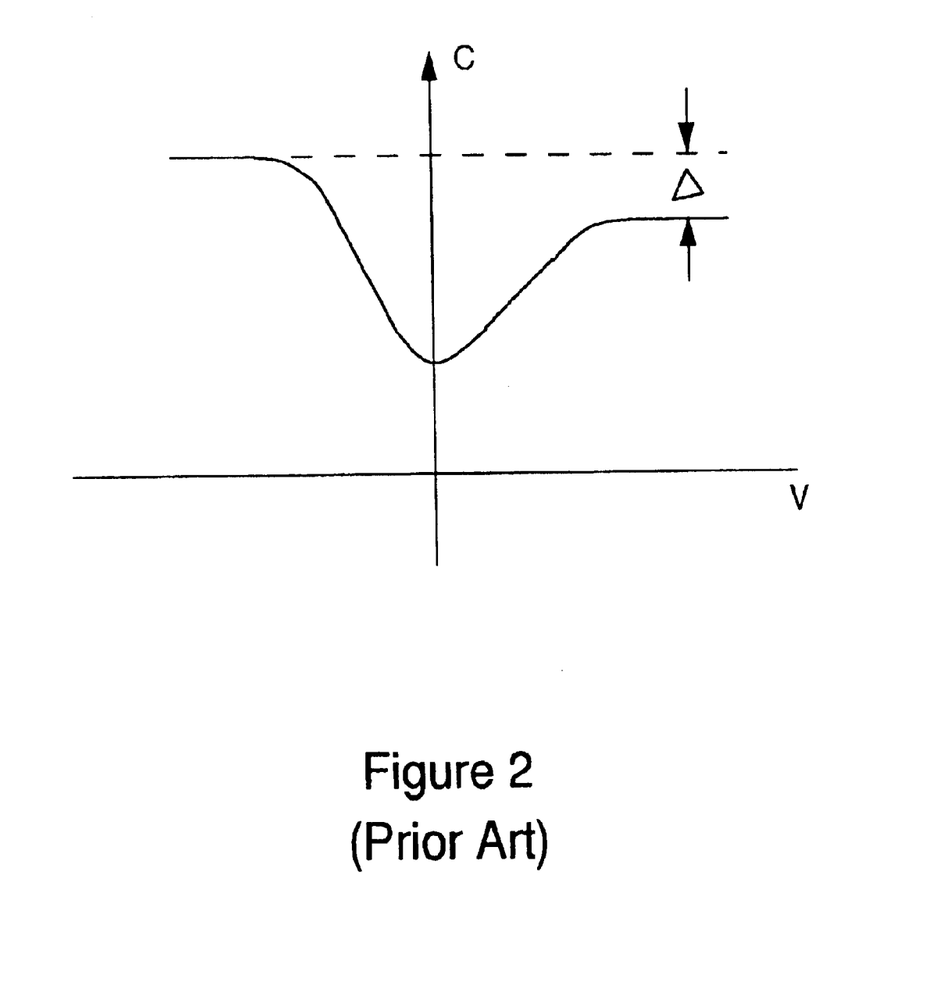
FIG. 2 shows a typical CV measurement for such a MOSFET.

FIG. 1 shows a MOSFET which is commonly used today to evaluate CV characteristics. This fully processed MOSFET structure includes a source and drain junction from which minority carriers can be supplied to form an inversion layer from which CV measurements can be taken. FIG. 2 shows a typical CV measurement for such a MOSFET. The Δ represents the polysilicon depletion effect.

Although fabricating a few test transistors is a more efficient way of evaluating the potentials of new fabrication processes, it can nonetheless be a complex, time-consuming, and expensive endeavor. A simple test MOSFET structure, such as the one shown in FIG. 1, can take upwards of forty or more process steps to implement.

Therefore, there exists a need in the semiconductor fabrication industry for an apparatus and method for more efficiently evaluating the electrical characteristics of wafers produced from a particular process. The present invention offers a unique, novel solution for evaluating semiconductor fabrication processes which is simpler, faster, and less expensive to implement than the currently practiced methodology.

DISCLOSURE OF THE INVENTION

The present invention pertains to the use of one or more capacitors to characterize the polysilicon gate depletion effects for a particular semiconductor fabrication process. In one embodiment, an N-Gate/N-Substrate capacitor is used. The gate of the N-Gate/N-Substrate capacitor is driven to depletion while the substrate is simultaneously driven to accumulation. Capacitance-voltage measurements are taken. Based on these CV measurements, the polysilicon depletion effects can be obtained for that fabrication process.

In another embodiment, a P-Gate/P-Substrate capacitor is used. The gate of the P-Gate/P-Substrate capacitor is driven to depletion while the substrate is simultaneously driven to accumulation. Capacitance-voltage measurements are taken. Based on these CV measurements, the polysilicon depletion effects can be obtained for that fabrication process.

Rather than using a traditional transistor structure to test the polysilicon gate depletion effects, the present invention uses a capacitor structure. The capacitor structure is a less complex process to construct than that of a transistor. As such, the present invention offers a faster, simpler, and less expensive method for determining the polysilicon gate depletion effects than that of the prior art.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE FOR CARRYING OUT THE INVENTION

The present invention pertains to a short-loop method of utilizing N-Gate/N-Substrate (NN) and P-Gate/P-Substrate (PP) capacitors to evaluate polysilicon gate depletion. In the following detailed description of the present invention, numerous specific details are set forth in order to provide a thorough understanding of the present invention. However, it will be obvious to one skilled in the art that the present invention may be practiced without these specific details or by using alternate elements or methods. In other instances well known methods, procedures, components, and circuits have not been described in detail as not to unnecessarily obscure aspects of the present invention.

Figure 3:
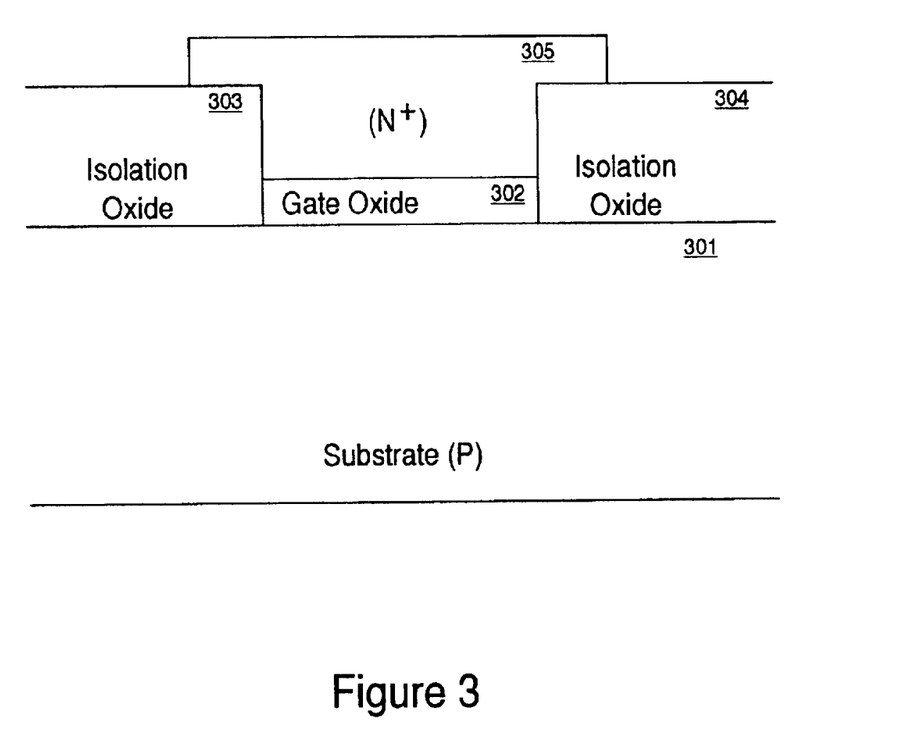
FIG. 3 shows a traditional capacitor structure.

Before describing in detail the capacitors utilized in the present invention, it is beneficial to describe traditional capacitor structures. A traditional capacitor structure is shown in FIG. 3. It can be seen that this capacitor structure is comprised of a P-doped substrate 301, gate oxide 302, isolation oxides 303–304, and N+ gate 305. This type of conventional capacitor structure is commonly referred to as an N-Gate/P-Substrate (NP) capacitor. This conventional NP capacitor cannot be used to observe the polysilicon depletion effect because both the substrate 301 and gate 305 are driven into accumulation simultaneously.

Figure 4:
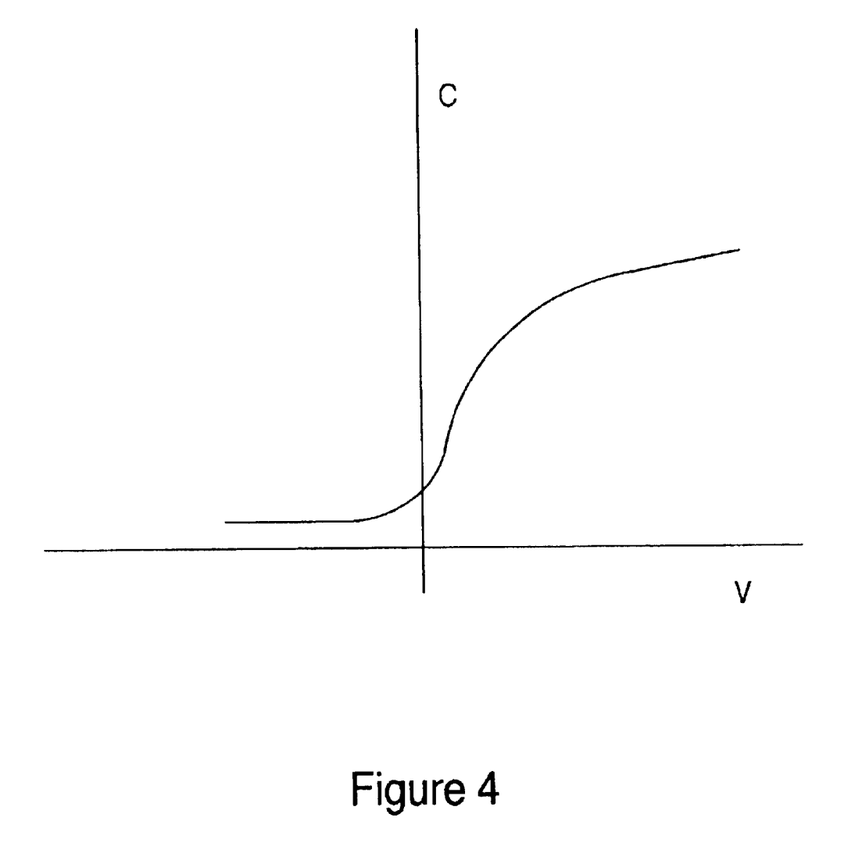
FIG. 4 shows a sample graph of a CV measurement for a conventional NP capacitor.

FIG. 4 shows a sample graph of a CV measurement for a conventional NP capacitor. It can be seen from this graph that there is no exhibited depletion effects.

Figure 5:
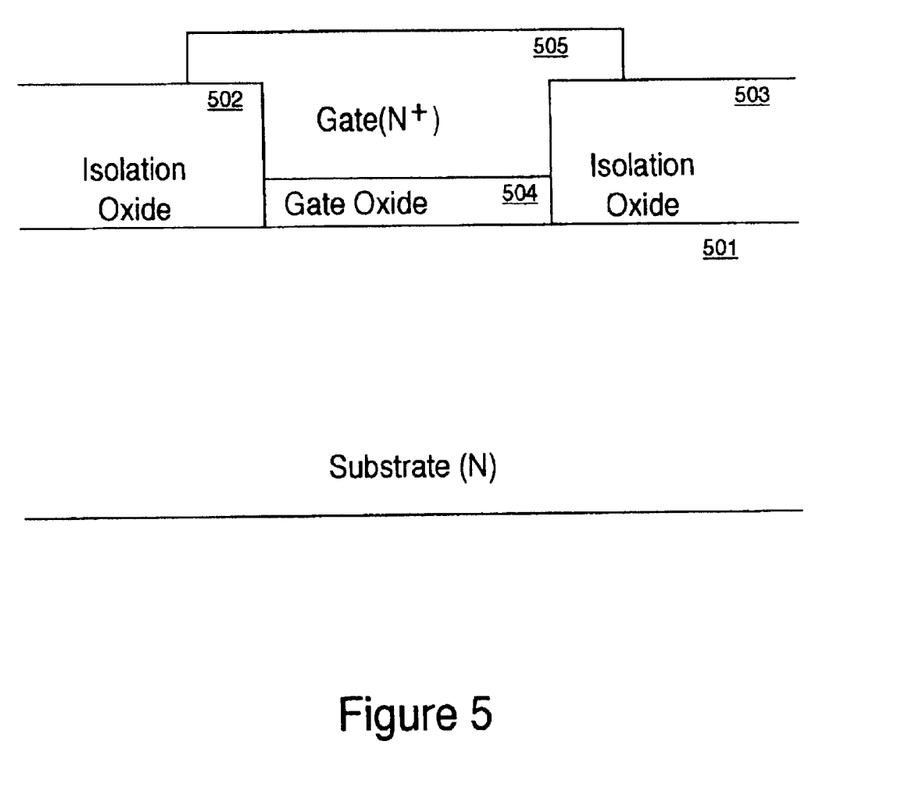
FIG. 5 shows the currently preferred embodiment of an N-Gate/N-Substrate capacitor according to the present invention.

Rather than use an P-type substrate, the present invention entails using a capacitor with a N-type substrate with an N+ doped gate. FIG. 5 shows the currently preferred embodiment of an N-Gate/N-Substrate capacitor according to the present invention. The N-Gate/N-Substrate capacitor is comprised of a N-type substrate 501. Isolation oxides 502 and 503 are disposed over the N-type substrate 501. A gate oxide layer 504 resides on top of N-type substrate 501 and in-between the two isolation oxides 502 and 503. A N+ doped gate 505 is then formed over the isolation oxides 502 and 503 and gate oxide 504. This new type of N-Gate/N-Substrate MOS capacitor provides a more efficient method to evaluate polysilicon gate depletion. The gate of the N-Gate/N-Substrate capacitor can be driven into depletion while the substrate is driven into accumulation simultaneously. Thereby, the CV characteristics can be obtained, and the polysilicon gate depletion effects are readily observed.

Figure 6:
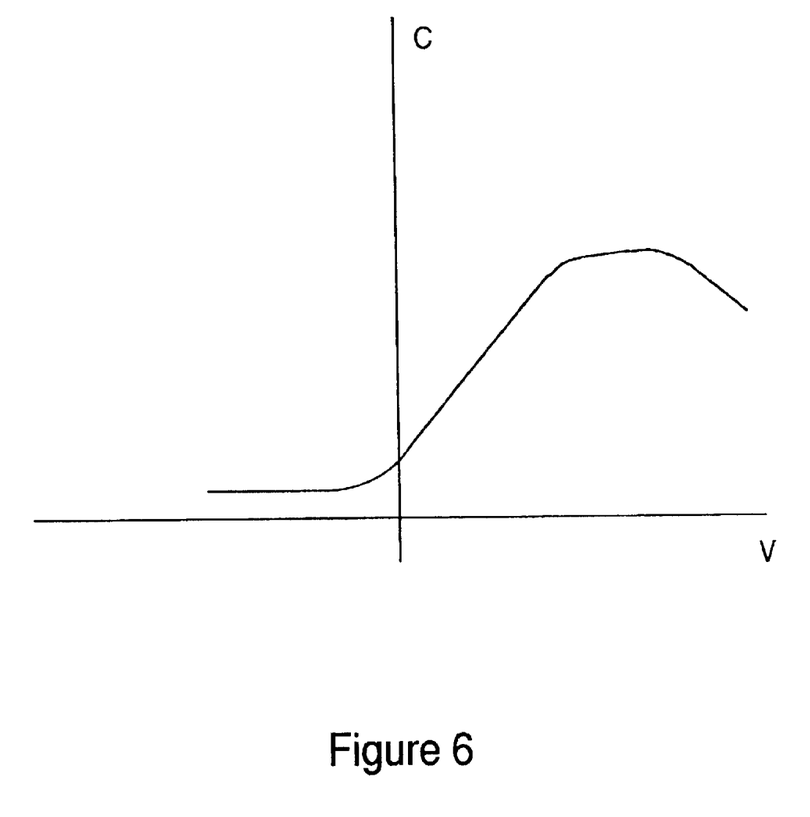
FIG. 6 shows an exemplary CV chart of an N-Gate/N-Substrate capacitor.

FIG. 6 shows an exemplary CV chart of an N-Gate/N-Substrate capacitor. It can be seen that the slope of the CV curve starts to extend downwards as voltage is increased to the gate. This is caused by the gate depletion effect. This measured voltage drop corresponds to the polysilicon gate depletion. Thereby, a chip's performance can be accurately characterized by measuring the voltage drop of the CV curve for an N-Gate/N-Substrate capacitor. It should be noted that the specific capacitance values given along the vertical axis and the specific voltage values given along the horizontal axis varies dependent upon the particular semiconductor fabrication process which is being tested. In each case, the general form of the CV curve 601 will conform to that shown in FIG. 6. As negative voltage is gradually decreased, the capacitance initially remains constant until a threshold negative voltage is attained, at which point, the capacitance increases proportional to additional increase in voltage. As more positive voltage is applied to the capacitor, the capacitance begins to actually decrease in value. This negative slope characterizes the polysilicon gate depletion associated with that particular semiconductor fabrication process.

Figure 7:
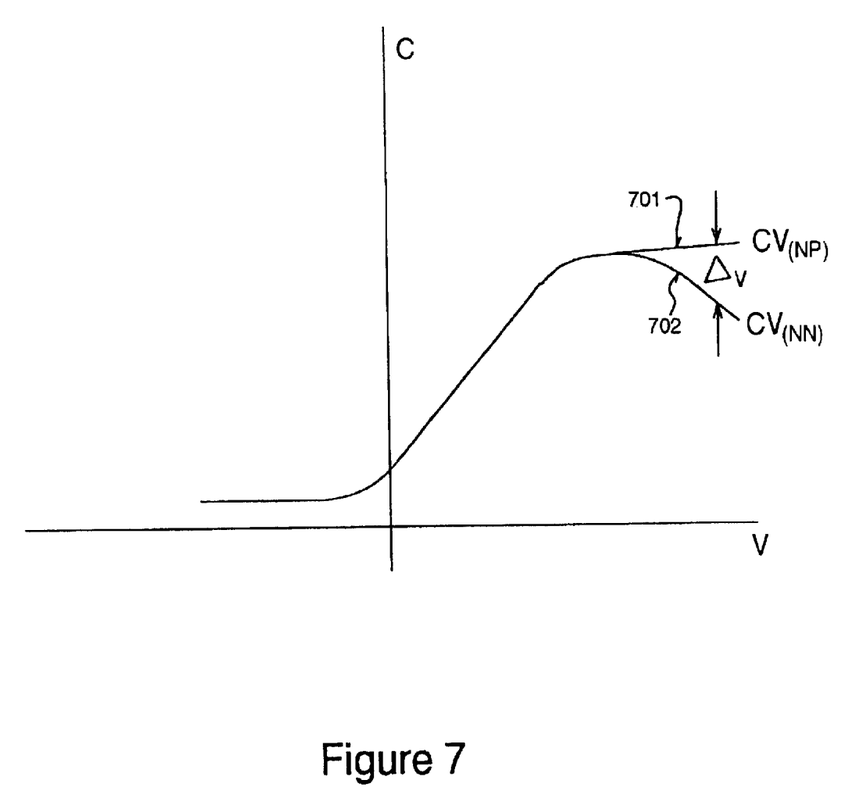
FIG. 7 shows an exemplary CV chart comparing a theoretical (or measured) conventional N-Gate/P-Substrate capacitor to that of the N-Gate/N-Substrate capacitor structure of the present invention.

FIG. 7 shows an exemplary CV chart comparing a theoretical (or measured) conventional N-Gate/P-Substrate capacitor to that of the N-Gate/N-Substrate capacitor structure of the present invention. The CV curve for the conventional N-Gate/P-Substrate capacitor is shown as trace 701. In comparison, the CV curve for the N-Gate/N-Substrate capacitor structure of the present invention is shown as trace 702. It can be seen that the $\Delta$ voltage drop between the two CV curves equates to the polysilicon gate effect $\Delta_v$.

Figure 8:
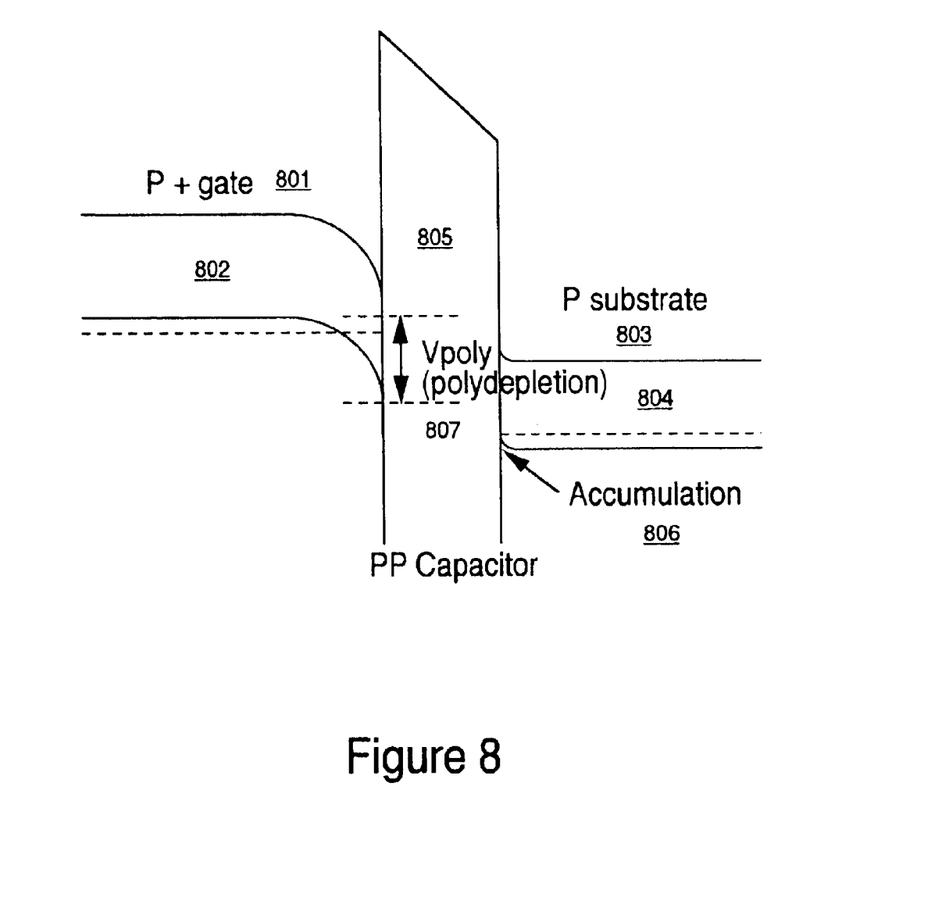
FIG. 8 shows the band diagram for a PP capacitor embodiment of the present invention.

FIG. 8 shows the band diagram for an exemplary PP capacitor embodiment of the present invention. This band diagram is used to evaluate a F-type gate (e.g., boron doped) structure. For a P-type gate capacitor, an N substrate is traditionally employed. However, the present invention contemplates utilizing a P substrate. The significance of implementing a P-type gate with a P substrate, is that when a negative voltage is applied to the gate, it attracts positive charge to the PP interface. This causes the P substrate 803 to go into accumulation 806. The accumulation is depicted by the flat part of the energy band 804 occurring in the P substrate 803. Only a relatively small amount of band bending is needed to build up the accumulation charge so that almost all of the potential variation is within the oxide. Simultaneously, the negative voltage on the gate attracts positive charge away from the PP interface towards the P+ gate 801. The energy band, in electron-volts (eV) for the P+ gate region 801 is shown as 802. It can be seen that as more negative voltage is applied, the P+ gate 801 is driven towards depletion. Consequently, the P+ gate 801 is driven to depletion while the P substrate 803 is driven to accumulation. Inevitably, the voltage on the gate drops off dramatically as it approaches the depletion region 805. It is this drop in the gate voltage, as depicted by Vpoly 807, which is used to characterize the polydepletion for that particular semiconductor fabrication process.

Figure 9A:
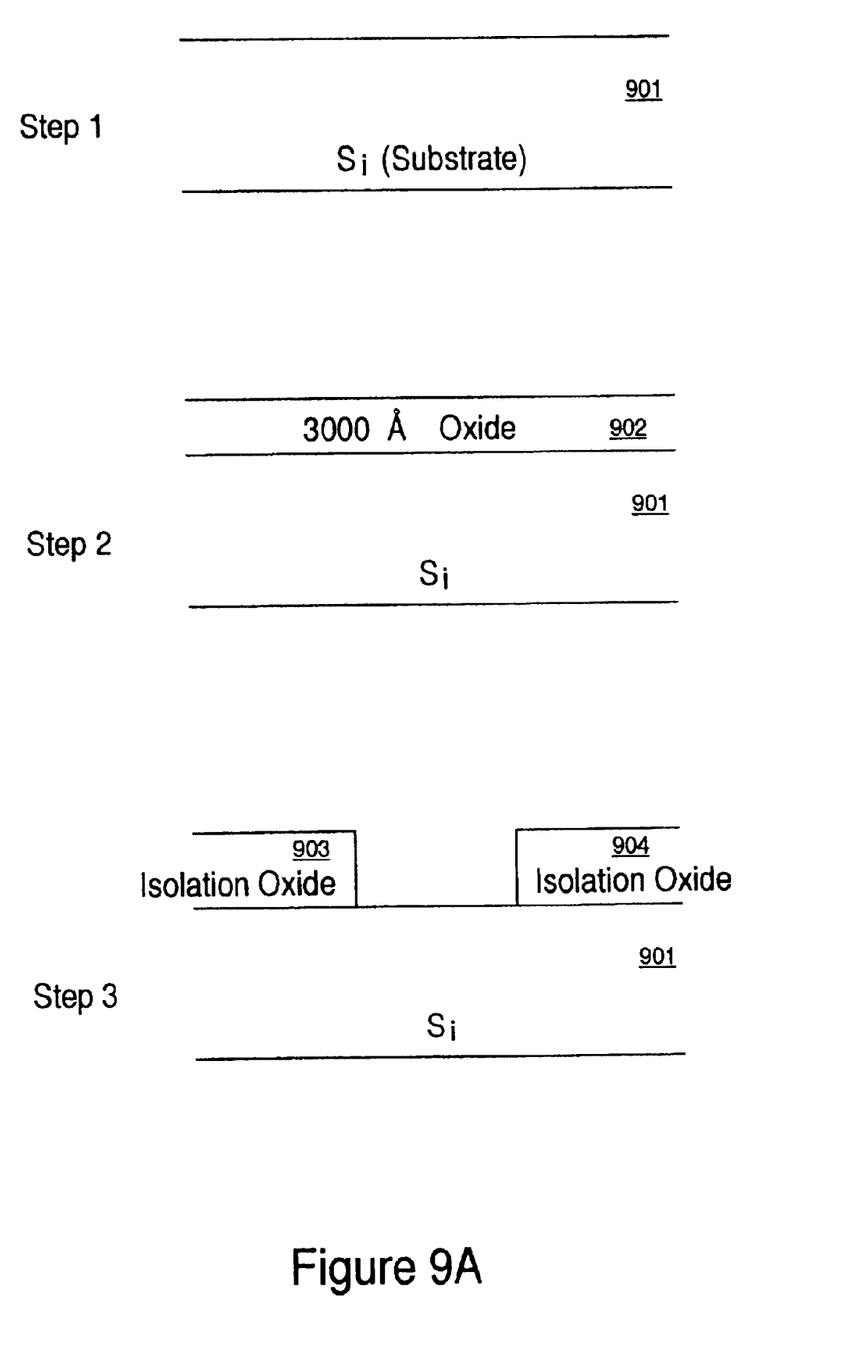
FIGS. 9A and 9B show the steps for making an NN capacitor according to the currently preferred embodiment of the present invention.
Figure 9B:
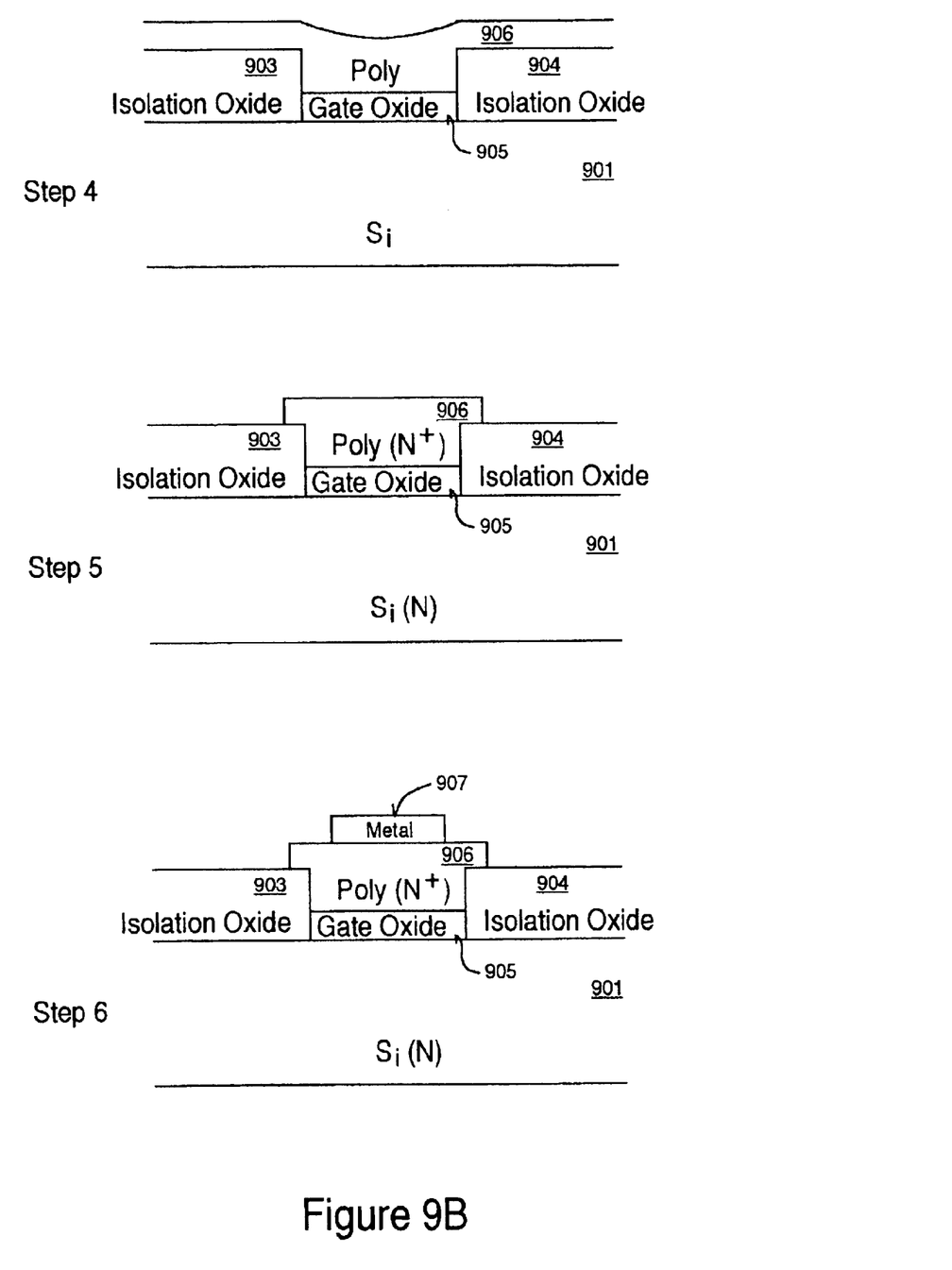

FIGS. 9A and 9B are side sectional views illustrating the steps for making an NN capacitor according to the currently preferred embodiment of the present invention. The first step is to start with a silicon substrate 901. An oxide layer 902 is then grown or deposited over the silicon substrate 901. The oxide layer can be approximately 3000 angstroms thick, step 2. Next, the oxide layer is defined via standard process steps to define two isolation oxide sections 903 and 904. In step 4, a gate oxide 905 is formed. In one embodiment, the gate oxide 905 is approximately 20 angstroms thick. At the same time, polysilicon 906 is deposited. In step 5, the polysilicon 906 is defined via standard semiconductor process techniques. In addition, the substrate is N doped, and the gate is N+ doped. The last step entails depositing and defining metal contact 907 to establish an electrical connection to the NN capacitor structure.

Figure 10:
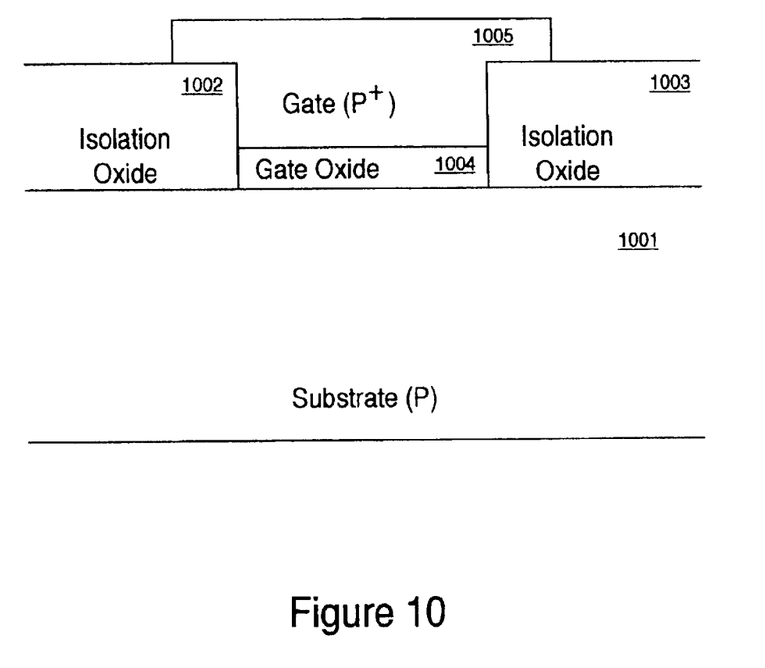
FIG. 10 shows a PP capacitor according to the present invention.

The present invention can also be implemented by using a capacitor having an P-type substrate with an P+ doped gate (PP) to characterize the polysilicon depletion effect. FIG. 10 shows a PP capacitor according to the present invention. The PP capacitor is comprised of a P-type substrate 1001. Isolation oxides 1002 and 1003 are disposed over the P-type substrate 1001. A gate oxide layer 1004 resides on top of P-type substrate 1001 and in-between the two isolation oxides 1002 and 1003. A P+ doped gate 1005 is then formed over the isolation oxides 1002 and 1003 and gate oxide 1004. It should be noted that the same fabrication process which is being evaluated is used to fabricate the PP capacitor structure of the present invention. Thereby, this new type of P-Gate/P-Substrate MOS capacitor provides an efficient method to evaluate polysilicon gate depletion. The gate of the PP capacitor can be driven into depletion while the substrate is driven into accumulation simultaneously. Consequently, the CV characteristics can be obtained, and the polysilicon gate depletion effects are readily observed.

The semiconductor process for fabricating a PP capacitor is the same as for an NN capacitor as described above and shown in FIGS. 9A and 9B with the exception that the substrate is P doped while the gate is P+ doped. Again, the same fabrication process which is being evaluated is used to fabricate the PP capacitor structure of the present invention.

Figure 11:
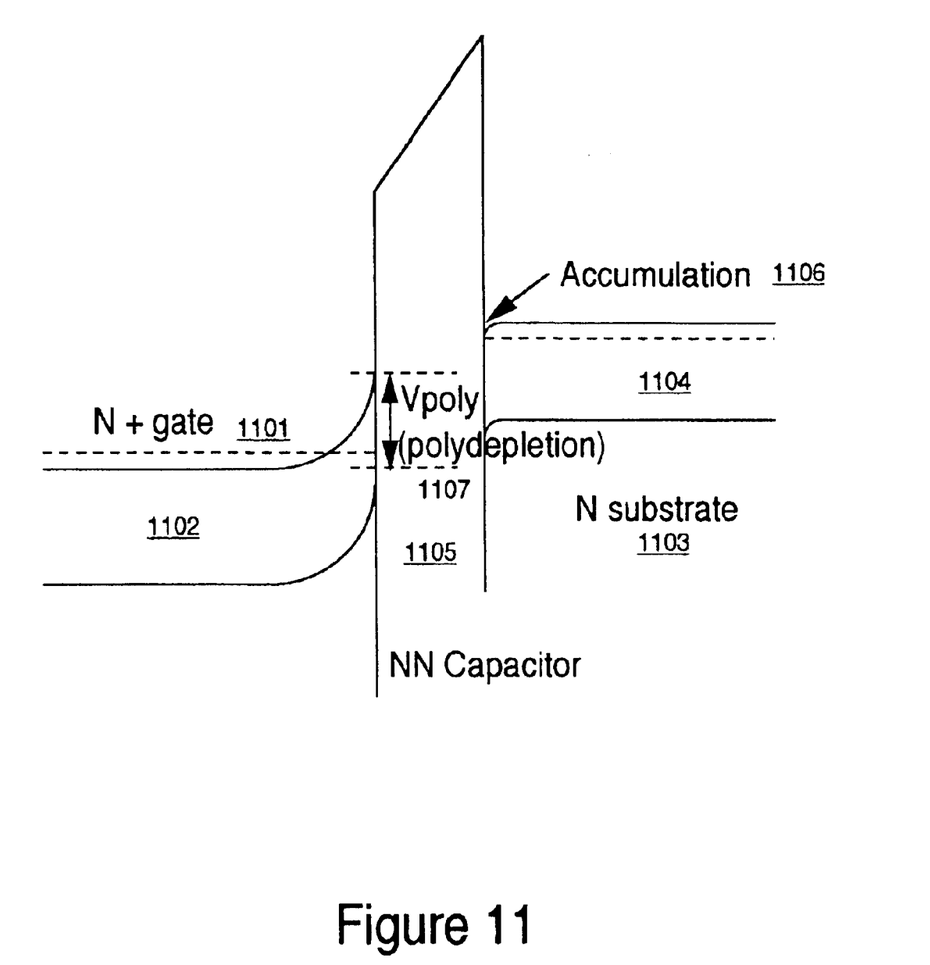
FIG. 11 shows the band diagram for an NN capacitor embodiment of the present invention.

FIG. 11 shows the band diagram for an exemplary NN capacitor embodiment of the present invention. This band diagram is used to evaluate a N-type gate (e.g., boron doped) structure. For an N-type gate capacitor, a P substrate is traditionally employed. However, the present invention contemplates utilizing an N substrate. The significance of implementing an N-type gate with an N substrate, is that when a positive voltage is applied to the gate, it attracts negative charge to the NN interface. This causes the N substrate 1103 to go into accumulation 1106. The accumulation is depicted by the flat part of the energy band 1104 occurring in the N substrate 1103. Only a relatively small amount of band bending is needed to build up the accumulation charge so that almost all of the potential variation is within the oxide. Simultaneously, the positive voltage on the gate attracts negative charge away from the NN interface towards the N+ gate 1101. The energy band, in electron-volts (eV) for the N+ gate region 1101 is shown as 1102. It can be seen that as more positive voltage is applied, the N+ gate 1101 is driven towards depletion. Consequently, the N+ gate 1101 is driven to depletion while the N substrate 1103 is driven to accumulation. As the voltage on the gate is increased, the energy band 1102 of the N+ gate region 1101 increases as it approaches the depletion region 1105. It is this sharp increase, as depicted by Vpoly 1107, which is used to characterize the polydepletion for that particular semiconductor fabrication process.

With an N-gate/N-substrate capacitor, the N doped substrate is grounded and a negative voltage is applied to the N+ gate. The negative voltage is varied while capacitance corresponding to the NN capacitor is measured. A C-V curve can be determined by plotting the measured capacitance as a function of the voltage applied to the N+ gate. The polysilicon gate depletion of a particular semiconductor fabrication process can thereby be determined based on the capacitance-voltage measurements.

Likewise, with a P-gate/P-substrate capacitor, the P doped substrate is grounded and a positive voltage is applied to the P+ gate. The positive voltage is varied while capacitance corresponding to the PP capacitor is measured. A C-V curve can be determined by plotting the measured capacitance as a function of the voltage applied to the N+ gate. The polysilicon gate depletion of a particular semiconductor fabrication process can thereby be determined based on the capacitance-voltage measurements.

The preferred embodiment of the present invention of an N Gate/N-Substrate or P Gate/P-Substrate capacitor for evaluating polysilicon gate depletion characteristics is thus described. While the present invention has been described in particular embodiments, it should be appreciated that the present invention should not be construed as limited by such embodiments, but rather construed according to the below claims.

What is claimed is:

1. A semiconductor device having a N-gate/N-substrate capacitor for characterizing polysilicon gate depletion corresponding to the semiconductor device, comprising:

an N doped substrate;

a gate oxide layer disposed over the N doped substrate;

a first isolation oxide and a second isolation oxide disposed over the N doped substrate, wherein the first isolation oxide and the second isolation oxide are separated by the gate oxide layer;

an N+ doped gate disposed over at least one portion of the first isolation oxide, the gate oxide, and the second isolation oxide.

2. The semiconductor device of claim 1, wherein the gate is in a depletion mode simultaneously while the N doped substrate is in an accumulation mode.

3. The semiconductor device of claim 1, wherein the polysilicon gate depletion of the semiconductor device corresponds to capacitor-voltage characteristics of the N-gate/N-substrate capacitor.

4. A semiconductor device having a P-gate/P-substrate capacitor for characterizing polysilicon gate depletion corresponding to the semiconductor device, comprising:

a P doped substrate;

a gate oxide layer disposed over the P doped substrate;

a first isolation oxide and a second isolation oxide disposed over the P doped substrate;

a P+ doped gate disposed over at least one portion of the first isolation oxide, the gate oxide, and the second isolation oxide.

5. The semiconductor device of claim 4, wherein the gate is in a depletion mode simultaneously while the substrate is in an accumulation mode.

6. The semiconductor device of claim 4, wherein the polysilicon gate depletion of the semiconductor device corresponds to capacitor-voltage characteristics of the P-gate/P-substrate capacitor.

7. A semiconductor capacitor structure, comprising:

an N doped substrate;

a gate oxide layer disposed over the substrate;

a first isolation oxide and a second isolation oxide disposed over the substrate;

an N+ doped gate disposed over the first isolation oxide, the gate oxide, and the second isolation oxide, wherein the semiconductor capacitor is used to characterize polysilicon gate depletion corresponding to a semiconductor fabrication process.

8. The semiconductor capacitor of claim 7, wherein the gate is in a depletion mode while the substrate is an accumulation mode.

9. The semiconductor structure of claim 7, wherein the polysilicon gate depletion corresponding to the semiconductor fabrication process is characterized by capacitor-voltage characteristics of the semiconductor capacitor.

10. A semiconductor capacitor structure, comprising:

an P doped substrate;

a gate oxide layer disposed over the substrate;

a first isolation oxide and a second isolation oxide disposed over the substrate;

a P+ doped gate disposed over the first isolation oxide, the gate oxide, and the second isolation oxide, wherein the semiconductor capacitor structure is used to characterize polysilicon gate depletion corresponding to a semiconductor process.

11. The semiconductor device of claim 10, wherein the gate is driven into depletion while the substrate is simultaneously driven into accumulation.

12. The semiconductor device of claim 10, wherein capacitance-voltage measurements are taken to characterize the polysilicon gate depletion of the semiconductor device.

* * * * *